United States Patent
Gallatin et al.

(10) Patent No.: US 7,055,126 B2
(45) Date of Patent: May 30, 2006

(54) RENESTING INTERACTION MAP INTO DESIGN FOR EFFICIENT LONG RANGE CALCULATIONS

(75) Inventors: Gregg M. Gallatin, Newtown, CT (US); Emanuel Gofman, Haifa (IL); Kafai Lai, Poughkeepsie, NY (US); Mark A. Lavin, Katonah, NY (US); Maharaj Mukherjee, Wappingers Falls, NY (US); Dov Ramm, Menashe (IL); Alan E. Rosenbluth, Yorktown Heights, NY (US); Shlomo Shlafman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 10/694,339

(22) Filed: Oct. 27, 2003

(65) Prior Publication Data

US 2005/0091634 A1    Apr. 28, 2005

(51) Int. Cl.
*G06F 17/50* (2006.01)
(52) U.S. Cl. .............................. 716/19; 716/7; 716/11
(58) Field of Classification Search ................ 716/2–4, 716/6–21
See application file for complete search history.

(56) References Cited

U.S. PATENT DOCUMENTS

| | | | |
|---|---|---|---|
| 5,619,419 A * | 4/1997 | D'Haeseleer et al. .......... 716/8 |
| 5,644,390 A | 7/1997 | Yasuzato |
| 5,647,027 A | 7/1997 | Burges et al. |
| 5,680,588 A | 10/1997 | Gortych et al. |
| 6,099,583 A * | 8/2000 | Nag ............................. 716/16 |
| 6,127,071 A | 10/2000 | Lu |
| 6,223,139 B1 | 4/2001 | Wong et al. |
| 6,233,056 B1 | 5/2001 | Naulleau et al. |
| 6,263,299 B1 | 7/2001 | Aleshin et al. |
| 6,289,499 B1 | 9/2001 | Rieger et al. |
| 6,303,253 B1 | 10/2001 | Lu |
| 6,415,421 B1 | 7/2002 | Anderson et al. |
| 6,425,113 B1 | 7/2002 | Anderson et al. |
| 6,449,387 B1 | 9/2002 | Inui |
| 6,453,457 B1 | 9/2002 | Pierrat et al. |
| 6,455,211 B1 * | 9/2002 | Yui et al. ...................... 430/22 |
| 6,460,997 B1 | 10/2002 | Frey et al. |
| 6,484,300 B1 * | 11/2002 | Kim et al. ...................... 716/7 |
| 6,677,089 B1 * | 1/2004 | Ogino et al. .................. 430/30 |
| 2002/0062206 A1 | 5/2002 | Liebchen |
| 2002/0126267 A1 | 9/2002 | Smith |
| 2002/0159040 A1 | 10/2002 | Hamatani et al. |

* cited by examiner

*Primary Examiner*—Vuthe Siek
*Assistant Examiner*—Nghia M. Doan
(74) *Attorney, Agent, or Firm*—DeLio & Peterson, LLC; Kelly M. Nowak; Steven Capella

(57) ABSTRACT

Methods, and program storage devices, for performing model-based optical lithography corrections by partitioning a cell array layout, having a plurality of polygons thereon, into a plurality of cells covering the layout. This layout is representative of a desired design data hierarchy. A density map is then generated corresponding to interactions between the polygons and plurality of cells, and then the densities within each cell are convolved. An interaction map is formed using the convolved densities, followed by truncating the interaction map to form a map of truncated cells. Substantially identical groupings of the truncated cells are then segregated respectively into differing ones of a plurality of buckets, whereby each of these buckets comprise a single set of identical groupings of truncated cells. A hierarchal arrangement is generated using these buckets, and the desired design data hierarchy enforced using the hierarchal arrangement to ultimately correct for optical lithography.

8 Claims, 6 Drawing Sheets

| 0 | 0 | 0 | 0 | 0 | 0 |
|---|---|---|---|---|---|
| 0 | 0 | 0 | 0 | 0 | 0 |
| 0 | 0 | 1 | 1 | 0 | 0 |
| 0 | 0 | 1 | 1 | 0 | 0 |
| 0 | 0 | 0 | 0 | 0 | 0 |
| 0 | 0 | 0 | 0 | 0 | 0 |

| 0.303 | 0.524 | 0.677 | 0.677 | 0.524 | 0.303 |
|---|---|---|---|---|---|
| 0.524 | 0.756 | 0.857 | 0.857 | 0.756 | 0.524 |
| 0.677 | 0.857 | 0.995 | 0.995 | 0.857 | 0.677 |
| 0.677 | 0.857 | 0.995 | 0.995 | 0.857 | 0.677 |
| 0.524 | 0.756 | 0.857 | 0.857 | 0.756 | 0.524 |
| 0.303 | 0.524 | 0.677 | 0.677 | 0.524 | 0.303 |

| 0.3 | 0.5 | 0.7 | 0.7 | 0.5 | 0.3 |
|---|---|---|---|---|---|
| 0.5 | 0.8 | 0.9 | 0.9 | 0.8 | 0.5 |
| 0.7 | 0.9 | 1.0 | 1.0 | 0.9 | 0.7 |
| 0.7 | 0.9 | 1.0 | 1.0 | 0.9 | 0.7 |
| 0.5 | 0.8 | 0.9 | 0.9 | 0.8 | 0.5 |
| 0.3 | 0.5 | 0.7 | 0.7 | 0.5 | 0.3 |

RENESTING INTERACTION MAP INTO DESIGN FOR EFFICIENT LONG RANGE CALCULATIONS

CROSS-REFERENCE TO RELATED APPLICATIONS

The present application is related to commonly assigned U.S. patent application Ser. Nos. 10/694,466, 10/694,465, 10/694,473, and 10/694,299, filed on even date herewith, which are hereby incorporated by reference herein in their entirety.

BACKGROUND OF THE INVENTION

1. Field of the Invention

This invention relates generally to the field of optical lithography, and in particular, to an approach for enforcing a design data hierarchy for long-range calculations, regardless of the size of the Region Of Interest (ROI), for use in model-based optical lithography simulations and Optical Proximity Correction (OPC).

2. Description of Related Art

The optical microlithography process in semiconductor fabrication, also known as the photolithography process, consists of duplicating desired circuit patterns onto semiconductor wafers for an overall desired design data hierarchy. The desired circuit patterns are typically represented as opaque and complete and semi-transparent regions on a template commonly called a photomask. In optical microlithography, patterns on the photomask template are projected onto photoresist-coated wafers by way of optical imaging through an exposure system.

Aerial image simulators, which compute the images generated by optical projection systems, have proven to be a valuable tool to analyze and improve the state-of-the-art in optical lithography for integrated circuit fabrication. These simulations have found application in advanced mask designs having many levels of hierarchy, such as phase shifting mask (PSM) design, optical proximity correction (OPC) for mask design, and the like. Modeling aerial images is a crucial component of semiconductor manufacturing. Since present lithography tools employ partially coherent illumination, such modeling is computationally intensive for all but elementary patterns. The aerial image produced by the mask, i.e., the light intensity in an optical projection system's image plane, is a critically important quantity in microlithography for governing how well a developed photoresist structure replicates a mask design.

However, optical proximity correction simulation kernels associated with lithographic processes for semiconductor chip manufacturing currently do not take into account the higher order aberrations, whose results may be realized in long-range effects, although not as prominent in the close-range of 1 to 2 micrometers. As the state of the art moves towards smaller wavelengths of light, such as 193 nm and 157 nm and extreme ultraviolet (EUV) 13 nm; and with device dimensions becoming considerably smaller in ratio to the wavelength of light that is used to print them on the wafer, the long-range effects, such as flare, become significant, making it imperative that higher order aberrations be considered.

Flare is generally defined as unwanted light in a lithographic process located in places where it should otherwise be dark. Where flare effects are constant, a dose shift compensates for its effects completely; however, wherein it is not constant, any unacceptable variation in flare effects can diminish the circuit performance, and ultimately cause catastrophic failure. As such, it is necessary to determine and compensate for any flare effects.

Hierarchical representation of designed mask shapes is a convenient method that is used in the current art for the storing of similar mask shapes. In the current art, a mask may contain in the order of a million shapes each representing certain device on the Very Large Scale Integrated (VLSI) Circuit. However, representing each such shape separately poses a great challenge to the computer algorithms that are used on such mask shapes. It is generally observed that many such mask shapes are equivalent to each other and their neighboring shapes are also equivalent to each other. The hierarchical representation of mask identifies such equivalence in the groups of shapes and their neighbors. The groups containing the base polygonal mask shapes may further be regrouped in the hierarchy. In this way, only a few basic shapes and their groups need to be stored for the whole mask which would result in a tremendous savings in terms of storage and run time for the above computer algorithms.

However, when the mask design needs to consider the very long range effect such as optical or chemical flare the interaction range becomes extremely large and consequently the neighborhoods of shapes that need to be regrouped becomes very large. The current art of determining hierarchy among equivalent shapes and their small and immediate neighborhoods fail in the case of such large interactions.

In the process of duplicating desired circuit patterns onto wafers, it is optimal to maintain the desired design data hierarchy, which often consists of several hierarchical levels. However, semiconductor wafer processes often catastrophically destroy the design data hierarchy, such as those involving long-range effects, where large regions of interest (ROI) are being exposed to such semiconductor processing steps.

For example, long-range flare effects generally occur across the ROI at a prime cell layer, i.e., the upper-most level of the hierarchical design, even for those ROIs up to 10 mm, which, can be close to a full chip size. If unaccounted for, these long-range flare effects ultimately destroy the design data hierarchy by erosion. Further, the larger the ROI around any given feature within the design hierarchy, the faster such feature will flatten by erosion.

For example, in the steps of computing density maps for any given level within the design hierarchy, any generated flare effects will cause a flatten or destruction of the design data hierarchy. This occurs as a result of the flare level image on one side of the hierarchal level being different from the flare level image on the opposing side of such hierarchal level. Conventional approaches that deal with these interactions between objects of different hierarchical levels typically move such objects to their common ancestor. Thus, for example, with respect to flare calculations for flare maps existing at the prime cell level, all features not on such prime cell level must be moved to the prime cell which causes the output design to become completely flat. As a result, without special handling, semiconductor processing steps that involve long-range effects, such as flare, can make the desired design hierarchy unachievable.

Unfortunately, the prior art has been hindered by the lack of solutions for enforcing a desired design data hierarchy for long-range calculations. Further, as it is necessary to determine and compensate for any flare effects, flattening of the desired design data hierarchy can prevent applying calculation to correct for any flare effects.

Accordingly, the present invention overcomes the above problems and deficiencies in the prior art by providing an approach for enforcing design data hierarchy for long-range calculations regardless of ROI size for use in model-based optical lithography simulations.

SUMMARY OF THE INVENTION

Bearing in mind the problems and deficiencies of the prior art, it is therefore an object of the present invention to provide a model-based approach for enforcing a design data hierarchy for long-range calculations regardless of region of interest (ROI) size for use in optical lithography.

It is another object of the present invention to provide a model-based approach that efficiently, easily and cost effectively maintains a desired design data hierarchy regardless of ROI size.

Another object of the present invention is to provide a model-based approach that efficiently, easily and cost effectively rebuilds a design data hierarchy when a desired design data hierarchy is destroyed.

Yet another object of the present invention is to provide a model-based approach that avoids flattening of the desired design data hierarchy such that flare calculations can be applied to the model-based simulation.

A further object of the invention is to provide a model-based approach for enforcing a design data hierarchy that saves both processing time and memory.

Still another object of the invention is to provide a model-based approach for enforcing a design data hierarchy that requires less disk memory to store the results of the rebuilt design hierarchy.

Yet another object of the invention is to provide a model-based approach for enforcing a design data hierarchy that provides stability in model-based optical lithography engines and calculations.

Still other objects and advantages of the invention will in part be obvious and will in part be apparent from the specification.

The above and other objects, which will be apparent to those skilled in art, are achieved in the present invention, which is directed to in a first aspect a method of performing model-based optical lithography corrections. The method includes providing a cell array layout, optionally a qausi-image, of a desired design data hierarchy having a plurality of finite geometrical shapes followed by partitioning the cell array layout into a plurality of cells. An interaction map is then generated based on a density map corresponding to interactions between the plurality of finite geometrical shapes and the plurality of cells. The interaction map is truncated to generate a map of truncated cells which is then used to group substantially identical occurrences of selected ones of the truncated cells into a single bucket selected from a plurality of distinct buckets. The desired design data hierarchy is then enforced using the plurality of distinct buckets to ultimately correct for optical lithography.

In this aspect, the desired design data hierarchy may comprise plurality of levels of hierarchy such that the method may occur at any of the plurality of levels of hierarchy. The plurality of finite geometrical shapes may be polygons, including regular polygon, irregular polygons, convex polygons, concave polygons, regular convex polygons, regular concave polygons, irregular convex polygons, irregular concave polygons and combinations thereof. The plurality of cells of the partitioned layout is preferably a plurality of finite shapes that are capable of covering an entire area of the cell array layout.

The method of this first aspect may further include computing the density map of a plurality of densities, one for each of the plurality of cells, wherein the plurality of densities correspond to the interactions for each of the plurality of cells. These densities are then convolved with an inverse power law kernel and the interaction map is generated using the plurality of convolved densities. The interactions between the shapes and the cells may be density effects including geometries of the finite geometrical shapes, an amount of coverage of the shapes, an area coverage, a computed aerial image coverage, a computed resist image coverage, perimeter coverage and combinations thereof.

Reference designators may be assigned to each of the truncated cells, wherein identical reference designators denote substantially identical truncated cells. The step of grouping substantially identical occurrences of the selected ones of the truncated cells transforms such cells into a single building block. In so doing, the method may generate a plurality of differing single building blocks that are used to generate hierarchal arrangement of these differing building blocks. This hierarchal arrangement is then used to enforce the desired design data hierarchy, either by maintaining the desired design data hierarchy, or alternatively, building a new design data hierarchy upon at least partial destruction of the desired design data hierarchy.

In a second aspect, the invention is directed to a method of performing model-based optical lithography corrections by providing a cell array layout representative of a desired design data hierarchy having a plurality of polygons thereon. The cell array layout is partitioned into a plurality of cells and then a density map is provided that corresponds to interactions between the polygons and the plurality of cells. An interaction map is generated based on the density map, which is subsequently truncated to generate a map of truncated cells. Substantially identical groupings of the truncated cells are then segregated respectively into differing ones of a plurality of buckets, whereby each of the plurality of buckets comprises a single set of the identical groupings of the truncated cells. A hierarchal arrangement is then generated using these buckets and the desired design data hierarchy enforced via use of the hierarchal arrangement. The method is to ultimately correct for optical lithography.

In this second aspect, it should be noted that the substantially identical groupings of the truncated cells transforms such groupings into a single building block, whereby a plurality of such single building block are ultimately used to generate the hierarchal arrangement. These building blocks may occur at numerous locations across the map of truncated cells, either as exact duplicates, rotated versions, mirrored versions, rotated-mirrored versions and combinations thereof. Also in this second aspect, the desired design data hierarchy may be enforced by maintaining the desired design data hierarchy, or alternatively, building a new design data hierarchy upon at least partial destruction of the desired design data hierarchy. The desired design data hierarchy and the new design data hierarchy may be identical to each other, or different from each other.

In third and fourth aspects of the invention, the present invention is directed to program storage devices that are readable by a machine, which tangibly embodies a program of instructions executable by the machine to perform the above method steps for performing model-based optical lithography corrections in relation to the first and second aspects of the invention, respectively.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
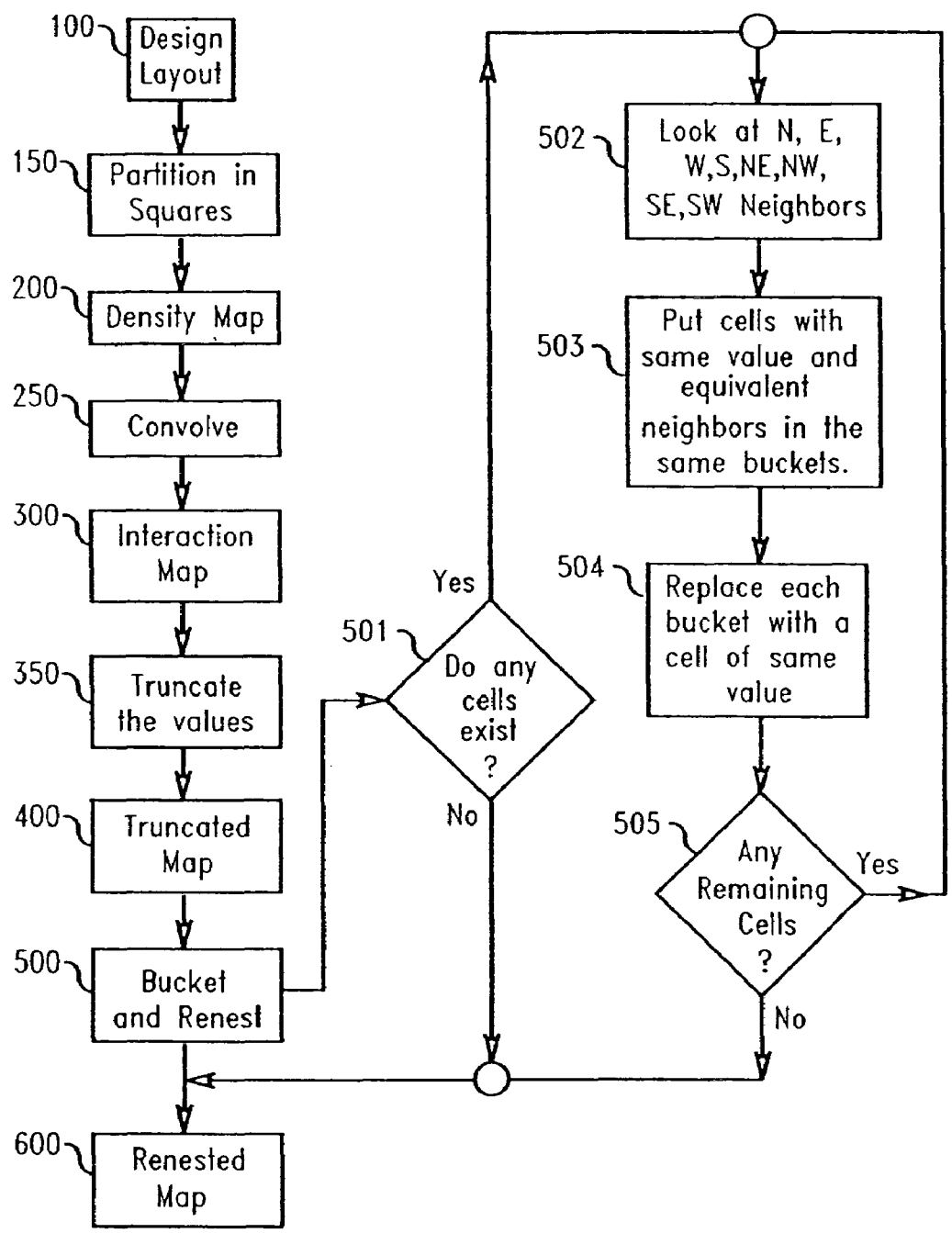
FIG. 1 is a block diagram flow chart of the preferred steps employed in practicing the present invention.

In describing the preferred embodiment of the present invention, reference will be made herein to FIGS. 1–4C of the drawings in which like numerals refer to like features of the invention.

The foregoing invention is ultimately for use in optical lithography to correct for any distortions on a photomask having desired circuit patterns, for the accurate projection thereof onto photoresist-coated wafers. In so doing, the invention provides model-based optical lithography simulations that enforce a desired design data hierarchy for long-range calculations, regardless of the size of the region of interest (ROI).

In accordance with the invention, the desired design data hierarchy is enforced by either maintaining an original, desired design data hierarchy or by rebuilding a design data hierarchy when the original, desired design data hierarchy has been either partially or completely destroyed, such as by processing conditions. However, the invention is particularly useful for those cases where the design data hierarchy must be rebuilt due to either partial or complete destruction of the original, desired design data hierarchy such as, for example, by flattening of the design hierarchy. As such, the invention advantageously avoids destruction and/or flattening of a desired design data hierarchy such that long-range effects can be compensated for in model-based optical lithography simulations including, but not limited to, aerial image calculations, optical proximity corrections, printed image predictions, model calibration and the like.

In a preferred embodiment of the invention, as it relates to flare calculations, the foregoing approach of enforcing desired design data hierarchy, either by maintaining or rebuilding design hierarchy, at least includes the steps of gradation of the flare map, selection of candidate cells, recalculating flare maps for those selected cells and then bucketing identical instances of such selected cells. However, it should be understood that the present invention may be used for any processing with smoothly-varying, large-ROI effects for which the protection of the design data hierarchy is beneficial.

Referring now to the drawings, FIG. 1A illustrates a preferred process flow of the invention wherein an initial desired design data hierarchy is first predetermined in step 100 using any known methods and apparatus. This predetermined desired design data hierarchy includes several levels (or layers) of hierarchy, as well as each level having predetermined circuitry patterns. For illustration purposes, and for ease of understanding the invention, the drawings refer to a schematic example of a portion of at least one of the hierarchal levels of the selected design hierarchy, preferably the upper-most level of the hierarchical design referred to as the prime cell layer. However, it should be appreciated that the invention may be used for any level within the design hierarchy.

Figure 2A:
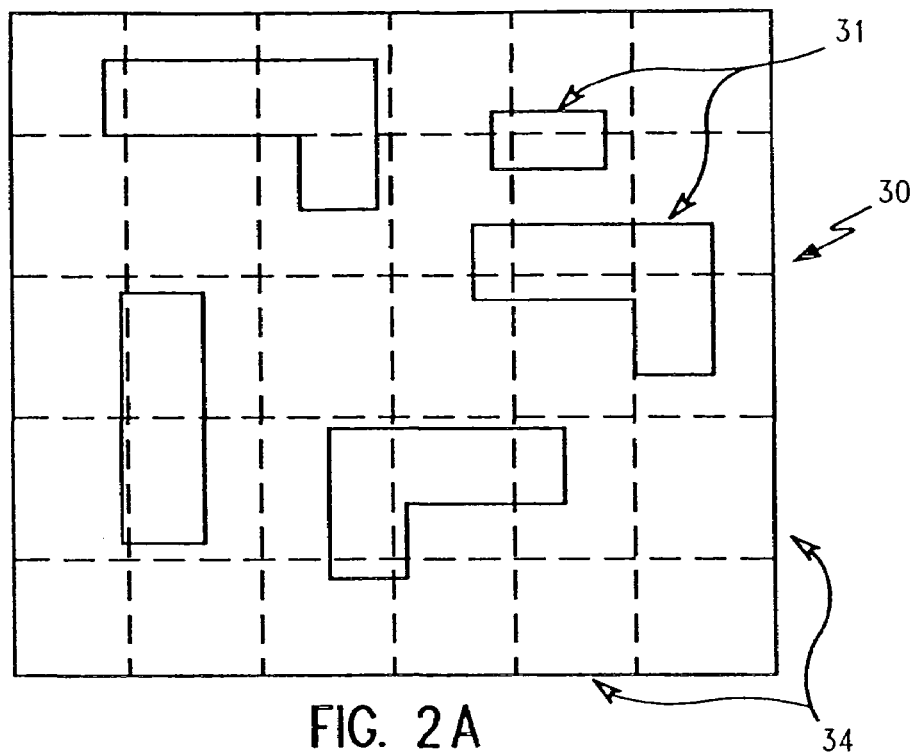
FIG. 2A is a schematic of a cell array layout having a plurality of finite geometrical shapes for use in the process flow of FIG. 1.

Referring to FIG. 2A, a cell array layout 30 of a portion of the prime cell level is shown for use in the present invention, whereby the cell array layout 30 has thereon a plurality of finite geometrical shapes 31. After the initial desired design data hierarchy is predetermined in step 100, the cell array layout 30 is divided or partitioned in step 150 into a plurality of uniform patterns, illustrated as uniform squares 34. However, it should be understood that the invention is suitable for use with any finite geometrical shape. For example, the cell array layout 30 may be partitioned into any type of polygon pattern that is capable of spanning and covering the whole layout including, but not limited to, regular or irregular, convex or concave, or any combination thereof. Further, in the present model-based simulation, the cell array layout 30 may be a qausi-image (or grey-scale images of shapes) of the predetermined desired design data hierarchy, therein being a significantly close replica thereof. That is, the cell array layout 30 is preferably not an exact image of the desired design hierarchy.

Figure 2B:
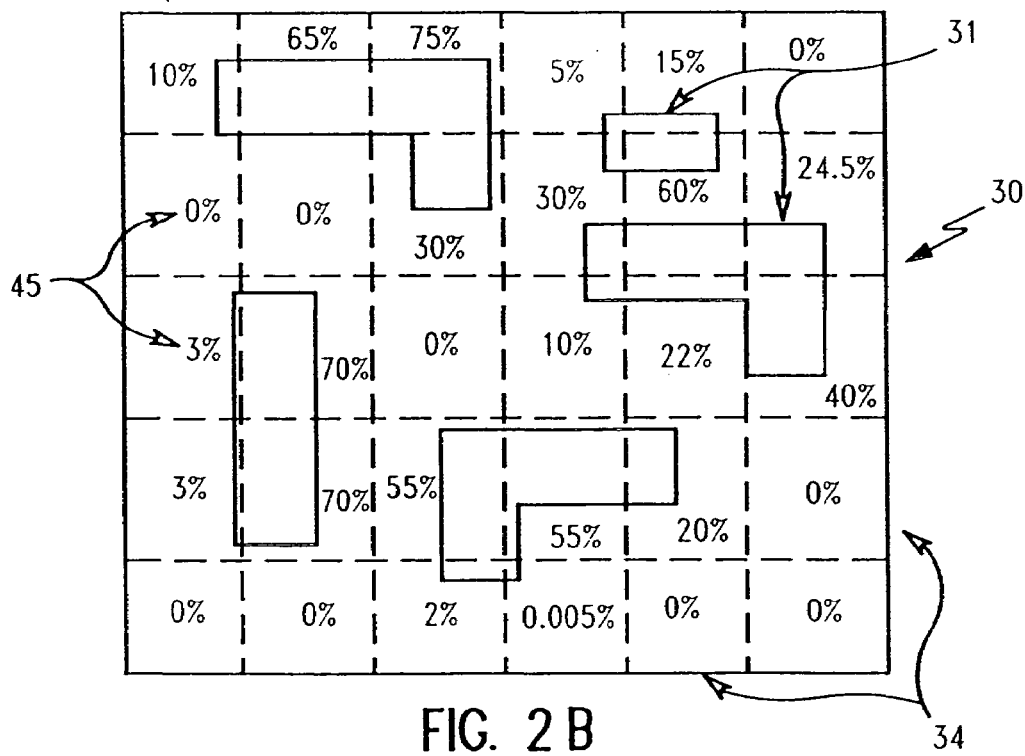
FIG. 2B is a schematic of a density map of the cell layout of FIG. 2A showing the layout partitioned into sections and an amount of each section covered by topography determined.

Once the layout 30 is divided into the plurality of uniform squares 34, a density map 40 of the layout, as shown in FIG. 2B, is computed in step 200. This is accomplished by initially dividing the layout 30 into each of the plurality of individual squares 34 followed by determining that portion of each square 34 that is covered by any finite geometrical shape(s) 31. Once the amount of coverage of each of the uniform squares 34 has been computed, each square 34 is then assigned a number based upon how much of that square is covered by finite geometrical shape(s) 31. For example, as shown in FIG. 2B the percentage of coverage of each square is illustrated, whereby this percentage represents a density number 45 for each square.

In accordance with the invention, the overall density map may represent numerous different density effects including, but not limited to, geometries of the finite geometrical shapes, the coverage of such geometries (e.g., the percentage of the present model-based hierarchal prime cell level that is covered by finite geometrical shapes versus that portion not covered by such shapes, such as that shown in FIG. 2B), the amount of coverage of the cell array layout 30 portion, area coverage, coverage by the computed aerial, resist or any other form of wafer image, perimeter coverage or any other topological coverage, and even combinations thereof.

After the overall density map 40 of the prime cell level is complete, i.e., once all density numbers 45 for the plurality of squares 34 have been computed, the invention proceeds with using this density map 40 which represents qausi-images of the shapes to enforce hierarchy, rather then using exact geometries. In so doing, the density map 40 enables enforcing hierarchy in the design data by convolution with the inverse power law kernel. That is, each density 45 operating at each of the plurality of squares 34 are convolved in step 250 with the inverse power law kernel to obtain a plurality of convolved operating densities across the density map.

Figure 2C:
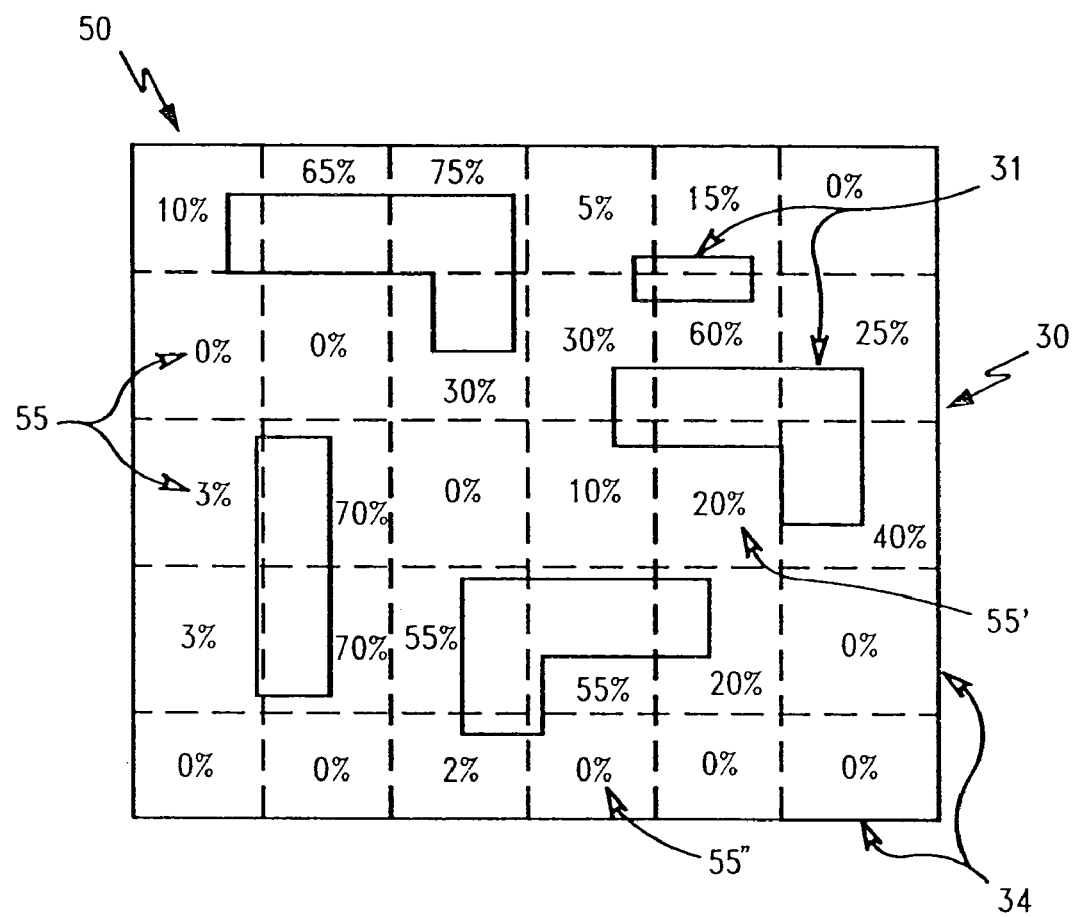
FIG. 2C is a schematic showing the step of truncating, i.e., rounding-off, the amounts of coverage of each square of the density map of FIG. 2B

A critical feature of the present invention is that these convolved operating densities for the numerous squares 34 are subsequently used in step 300 of the invention to generate an interaction map that is a table of smooth functions represented by floating point numbers of all of the stored convolved operating densities of each of the squares 34. Using this interaction map or table, each of the plurality of convolved operating densities are then truncated in step 350, i.e., round-off, to generate a truncated map 50 in step 400, as depicted in FIG. 2C. This step of truncating convolved operating densities is also referred to as gradation.

In the invention, the truncated map 50 is generated by replacing convolved densities with truncated densities 55, whereby these truncated densities comprise convolved densities replaced by a closest number divisible by 5. For example, referring to FIGS. 2B and 2C, the square having a convolved density of 22% has been replaced by 20% as denoted by reference numeral 55', the square having a convolved density of 0.005% has been replaced by 0% as denoted by reference numeral 55", and so forth. In so doing, a first convolved operating density may be truncated such that it is represented by a slightly coarse number which is considered to be an equivalent of a second convolved operating density, therein avoiding the need to make any fine distinctions there between the first and second convolved operating densities, which in turn, saves both processing run time and memory requirements.

Figures 3A, 3B, 3C:
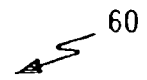
FIG. 3A is a schematic of another example of a cell layout for use in the process flow of FIG. 1 showing the cells of such layout having assigned designators based on the truncated results of FIG. 3C.
FIG. 3B is a schematic of the cell layout of FIG. 3A showing the cells having convolving densities.
FIG. 3C is a schematic showing the results of truncating the convolved cell densities of FIG. 3B.

The truncated densities 55 are then each assigned a reference designator, such as reference numerals, wherein like reference designators denote similar or substantially identical squares 34. In some instances, squares 34 may be substantially identical squares (or equivalents) as a result of the truncation step 400 of the invention. As is depicted in another example of the invention, FIGS. 3A–3C illustrate a square mask shape, whereby as shown in FIG. 3A, the center four squares of such mask shape have similar density values of 1, while the squares surrounding such central four squares are all similar having density values of 0. In accordance with the invention, the results of FIG. 3A are achieved by initially convolving densities of the squares as shown in FIG. 3B, followed by truncating the convolved densities as shown in FIG. 3C and assigning designators as shown in FIG. 3A.

In the preferred embodiment of the invention, wherein the long-range effects include flare effects, the step of truncating convolved cell or square densities is referred to as gradation of a flare map. Grading refers to a many-to-one mapping of a set of high precision computed numbers to a set of low-precision numbers. In flare map gradation, the mask or finite geometrical shapes (polygons) used are typically designed with a pre-defined precision in initial design step, whereby convolved cell densities typically describe geometries of these designs shapes that are represented on a grid display of the hierarchal level being simulated. However, this grid display is often restricted by resolution capabilities, and as such, imposes minimal actual value on the predetermined design. Again, as one of the objectives of the invention is to improve the hierarchy of the design by renesting or rebuilding the flare map, there is no point in preserving such initial design in any higher precision than that defined in the design step.

Accordingly, the present invention advantageously overcomes such problems by truncating the initial predetermined design integers such that flare calculations will be capable of defining the amount that original geometries are truncated due to flare effects. In so doing, the ranges of flare are preferably estimated so that flare effects on geometries differ only on a part of the design step. As flare is an effect of the second order, in comparison to effects of nearby objects, it is estimated that a relatively small amount of ranges (around one dozen) in flare map presentation is sufficient for flare calculation. In this way, the initial flare map that was created as a table of floating point numbers has been reworked in accordance with the invention, i.e., truncated, to contain only a limited number of different values.

The process flow of the invention continues in step 500 by bucketing and renesting truncated density map values computed in step 400. The process of bucketing is essential for the step of renesting the hierarchy as bucketing groups of squares or cells having the same densities along with the same neighboring squares or cells into a single class or "bucket". These "buckets" are then used to renest, i.e., rebuild, design data hierarchy such that a hierarchy is enforced. In the process of rebuilding the hierarchy, these "buckets" may still further be regrouped with neighboring buckets.

Figure 4:
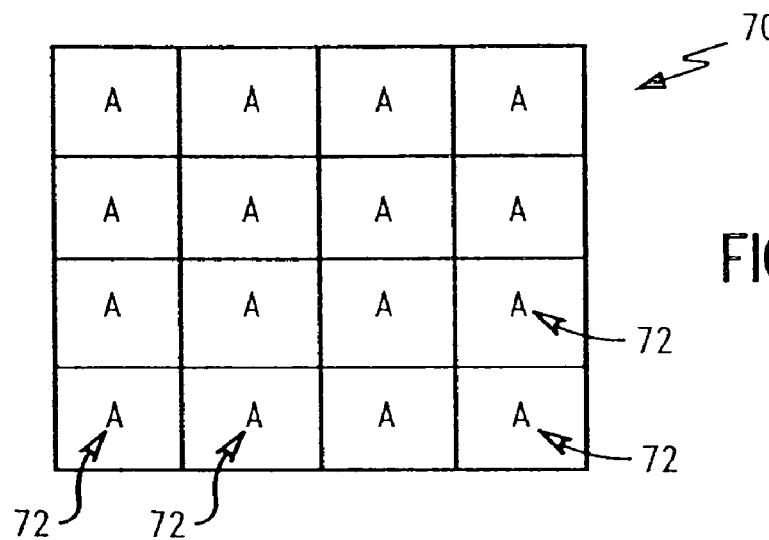
FIG. 4A is a schematic of still another example of a cell/mask layout for use in the process flow of FIG. 1 showing the cells of the layout having the same computed and truncated density values "A."
FIG. 4B is a schematic of the cell layout of FIG. 4A showing the results of assigning designators to such cells based on the density "A" and their respective neighboring cells in the N, E, S, W, NE, NW, SW, SE directions.
FIG. 4C is a schematic of the cell layout of FIG. 4B showing the results of bucketing and renesting, whereby selected buckets representing substantially identical cells or cell groupings may be repeated at numerous occurrences across the truncated map of the invention, whereby these buckets are subsequently used to rebuild hierarchy.
Figure 4:
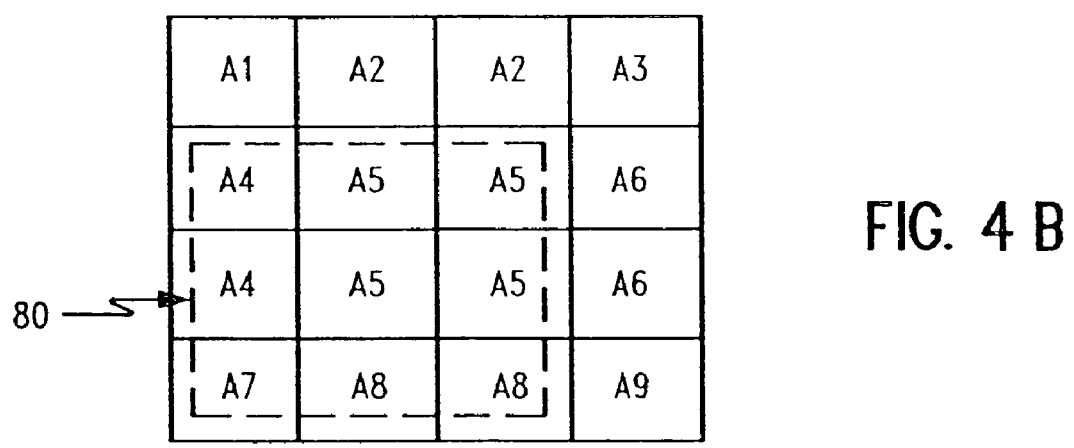
Figure 4C:
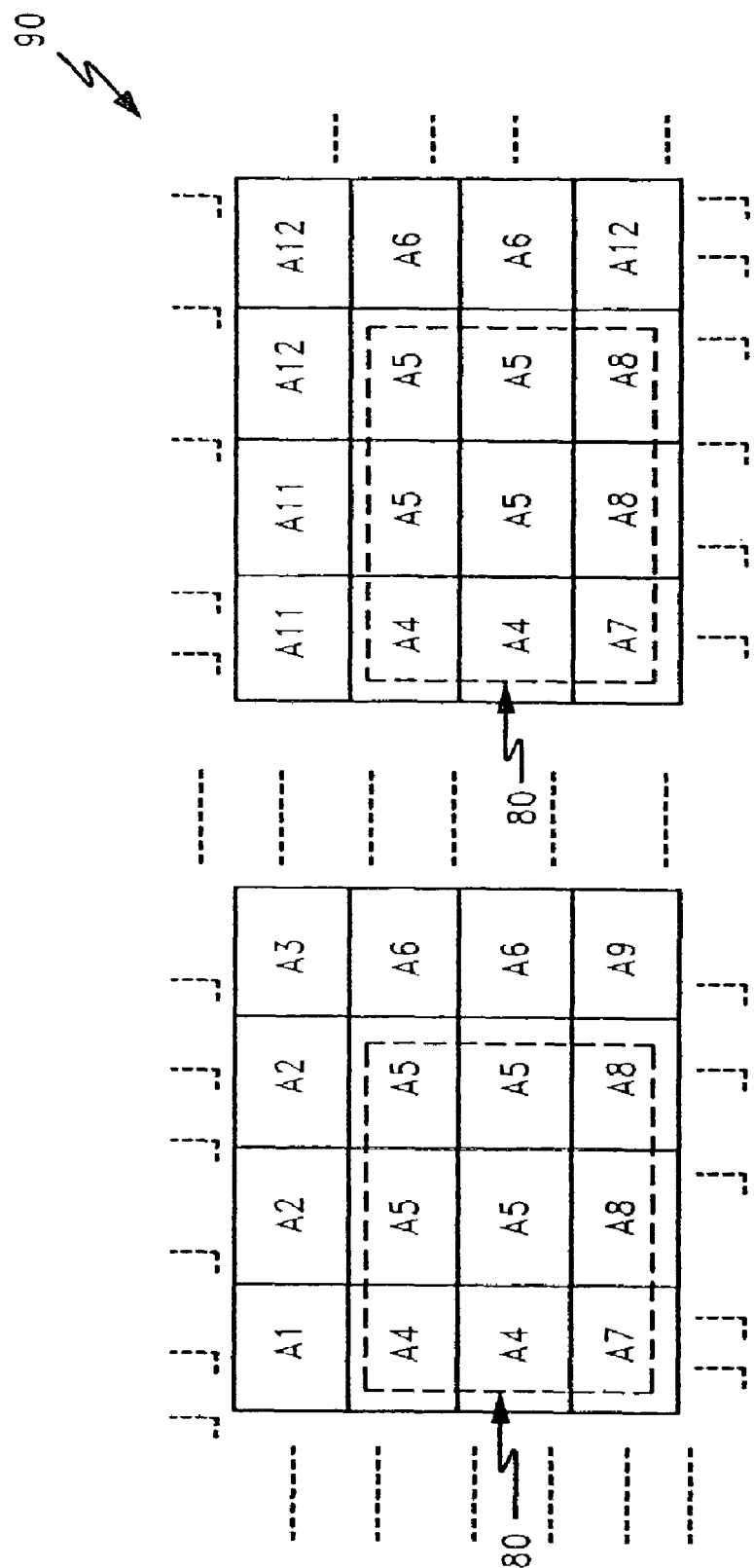

Referring to FIGS. 4A–4C, a mask layout 70 is shown in FIG. 4A whose density values have been computed and truncated in accordance with the steps of the invention as described above. In this particular example, all 16 squares have the same truncated density value "A" 72. As depicted, the four squares "A" in the center of the layout 70 are all surrounded by squares with the same density "A" on the left (West "W"), bottom (South "S"), right (East "E"), top (North "N") and all diagonals (NE, NW, SE and SW).

In the bucketing and renesting step 500 of the invention all four squares "A" in the center of the layout 70 are identified as being equivalent to one another, as is depicted by the markings "A5" in FIG. 4B. In this same manner, squares marked as "A4" denote those squares within mask layout 70 having density "A" and whose neighboring E, N, NE and SE cells all have the same densities "A". Likewise, squares marked as "A3" denote those squares within the mask layout 70 having density "A" and whose neighboring W, S and SW cells all have the same densities "A". This bucketing and renesting step 500 continues so forth within the layout 70.

In a preferred embodiment of the bucketing and renesting step 500 of the invention, initially it is determined whether any cell (square) or groups of cells exist for renesting (step 501). If it is determined that no cell or groups of cells exist, then the process flow continues to step 600 to renest, i.e., rebuild, the design hierarchy. However, if a cell or groups of cells do in fact exist, then in accordance with the invention, the density value of each cell is determined and all neighboring cells, i.e., N, E, S, W, NE, NW, SE and SW, located. The invention may also consider and locate any predefined neighboring cells or groups of cells via extension. In step

503, those cells having the same values and with corresponding neighbors with the same truncated values are grouped in a single common bucket.

The invention may generate a plurality of different buckets, each having sets of common cells or groupings thereof, whereby each of these buckets is assigned as a single larger cell having a value, whereby this single larger cell may occur at numerous instances or locations across a truncated map. For example, as depicted by the dashed lines in FIGS. 4B and 4C, the bucket 80 of groupings of squares having density "A" of FIG. 4B occurs at numerous, varying locations across a truncated map 90 as shown in FIG. 4C. It should be appreciated that the nine squares as shown in FIGS. 4B and 4C are for illustration purpose only, and any of a variety of similar neighboring arrays can be generated using any number of cells in accordance with the invention.

Accordingly, in view of the foregoing description of the bucketing and renesting step 500, any cell occurrences having identical or substantially similar interaction maps are collected into buckets. In so doing, portions of truncated maps that are considered substantially similar to each other become equivalent following the regrouping step, wherein a distance between such maps does not exceed one grade in any point. All of the basic building blocks of the invention are preferably selected such that they contain a variety of different finite geometrical shapes. Preferably, these building blocks include substantially all detectable shapes, while others contain selected ones of the detectable shapes. Wherein only selected ones of the detectable shapes are included within the building block, preferably, at least a couple of dozen of those geometrical shapes having a higher number of occurrences within the hierarchal level are selected.

An essential feature of the invention is that the basic building blocks of the invention transform the smaller squares, e.g. those having value "A" (following a step of convolution and truncation), into larger groups or units of squares. In so doing, these groups of smaller squares are collapsed to form a new, larger single basic building block of the invention such as, for example, building block 80 of FIGS. 4B and 4C.

The invention then generates a hierarchal arrangement of these basic building blocks to ultimately rebuild hierarchy or generate a renested map in step 600 such that design data hierarchy is enforced for long-range calculations, particularly in those instances where the original design data hierarchy may have been lost or destroyed due to processing conditions. The hierarchal arrangement of the basic building blocks are generated by determining or computing occurrences of selected cells or groups of cells within a map, wherein these building blocks may repeat numerous times (e.g., hundred, thousands, and even millions of times) across the map. The repetitions of these building blocks may include exact duplicates thereof, rotated versions, mirrored versions as well as rotated-mirrored versions of these building blocks. The locations and number of all occurrences of the basic building blocks within the map are then computed, indexed and stored to build hierarchal arrangements of the building blocks via point-by-point comparisons between cell instances.

For each bucket a new design data hierarchy is generated and the corresponding interaction maps within the bucket are attached to this new design data hierarchy. These buckets having their corresponding new design data hierarchy are then used to enforce design data hierarchy, preferably by rebuilding an original, desired design data hierarchy once it is lost or destroyed as a result of processing conditions. In so doing, transforms of the original design data hierarchy are replaced by these transforms of new design data hierarchy. The new design data hierarchy may be identical or not identical to the originally desired design data hierarchy.

Accordingly, the present invention uses the concept of hierarchical processing to enforce design data hierarchy, preferably by rebuilding an original, desired design data hierarchy once it is lost or destroyed as a result of processing conditions including, but not limited to, those involving density map computations which generate destructive flare effects. An advantage of the invention is that it avoids the need to perform long-range imaging calculations for each square having value "A" within an interaction map, as these squares having value "A" are convolved, truncated, hierarchically arranged and then bucketed with identical occurrences of the same such that a new hierarchy is built (renested) for the purpose of enforcing design data hierarchy. In so doing, a significant amount of computation and processing time are saved, as well as a significant reduction in processing memory requirements is realized.

The rebuilt hierarchy map may then be used for any long-range computation. Alternatively, the rebuilt hierarchy map of the invention may be used for a variety of other computations that do not rely on exact geometries of shapes, such as, image density maps, perimeter maps and the like. In the preferred embodiment, after the original design data hierarchy has been reprocessed as described above, flare calculations can then be imbedded in a standard simulation procedure.

The method may be implemented through a computer program product stored on a program storage device that is readable by a machine and tangibly embodies a program of instructions executable by the machine to perform each of the method steps. The program storage devices of the present invention may be devised, made and used as a component of a machine utilizing optics, magnetic properties and/or electronics to perform the method steps of the present invention. Program storage devices include, but are not limited to, magnetic diskettes, magnetic tapes, optical disks, Read Only Memory (ROM), floppy disks, semiconductor chips and the like. A computer readable program code means in known source code may be employed to convert the methods described above for use on a computer.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of performing model-based optical lithography corrections comprising:

providing a cell array layout of a desired design data hierarchy having a plurality of finite geometrical shapes;

partitioning said cell array layout into a plurality of cells;

generating an interaction map based on a density map corresponding to interactions between said plurality of finite geometrical shapes and said plurality of cells, including:

computing said density map comprising a plurality of densities, one for each of said plurality of cells, wherein said plurality of densities correspond to said interactions for each of said plurality of cells;

providing a plurality of convolved densities by convolving said plurality of densities with an inverse power law kernel;
generating said interaction map using said plurality of convolved densities;
truncating said interaction map to generate a map of truncated cells;
grouping substantially identical occurrences of selected ones of said truncated cells into a single bucket selected from a plurality of distinct buckets; and
enforcing said desired design data hierarchy using said plurality of distinct buckets to correct for optical lithography.

2. A method of performing model-based optical lithography corrections comprising:
providing a cell array layout representative of a desired design data hierarchy having a plurality of polygons thereon;
partitioning said cell array layout into a plurality of cells;
providing a density map corresponding to interactions between said polygons and said plurality of cells, said density map comprising a plurality of densities, one for each of said plurality of cells;
convolving said plurality of densities with an inverse power law kernel;
generating an interaction map based on said density map;
truncating said interaction map to generate a map of truncated cells;
segregating substantially identical groupings of said truncated cells respectively into differing ones of a plurality of buckets, whereby each of said plurality of buckets comprises a single set of said identical groupings of said truncated cells,
generating a hierarchal arrangement using said plurality of buckets; and
enforcing said desired design data hierarchy using said hierarchal arrangement to correct for optical lithography.

3. A program storage device readable by a machine, tangibly embodying a program of instructions executable by the machine to perform method steps for performing model-based optical proximity correction, said method steps comprising:
providing a cell array layout of a desired design data hierarchy having a plurality of finite geometrical shapes;
partitioning said cell array layout into a plurality of cells;
generating an interaction map based on a density map corresponding to interactions between said plurality of finite geometrical shapes and said plurality of cells, including;
computing said density map comprising a plurality of densities, one for each of said plurality of cells, wherein said plurality of densities correspond to said interactions for each of said plurality of cells;
providing a plurality of convolved densities by convolving said plurality of densities with an inverse power law kernel;
generating said interaction map using said plurality of convolved densities;
truncating said interaction map to generate a map of truncated cells;
grouping substantially identical occurrences of selected ones of said truncated cells into a single bucket selected from a plurality of distinct buckets; and
enforcing said desired design data hierarchy using said plurality of distinct buckets to correct for optical lithography.

4. A program storage device readable by a machine, tangibly embodying a program of instructions executable by the machine to perform method steps for performing model-based optical proximity correction, said method steps comprising:
providing a cell array layout representative of a desired design data hierarchy having a plurality of polygons thereon;
partitioning said cell array layout into a plurality of cells;
providing a density map corresponding to interactions between said polygons and said plurality of cells, said density map comprising a plurality of densities, one for each of said plurality of cells;
convolving said plurality of densities with an inverse power law kernel;
generating an interaction map based on said density map;
truncating said interaction map to generate a map of truncated cells;
segregating substantially identical groupings of said truncated cells respectively into differing ones of a plurality of buckets, whereby each of said plurality of buckets comprises a single set of said identical groupings of said truncated cells,
generating a hierarchal arrangement using said plurality of buckets; and
enforcing said desired design data hierarchy using said hierarchal arrangement to correct for optical lithography.

5. A method of performing model-based optical lithography corrections comprising:
providing a cell array layout of a desired design data hierarchy having a plurality of finite geometrical shapes;
partitioning said cell array layout into a plurality of cells;
generating an interaction map based on a density map corresponding to interactions between said plurality of finite geometrical shapes and said plurality of cells;
truncating said interaction map to generate a map of truncated cells, including assigning a reference designator selected from a group of reference designators to each of said truncated cells wherein identical reference designators denote substantially identical truncated cells;
grouping substantially identical occurrences of selected ones of said truncated cells into a single bucket selected from a plurality of distinct buckets; and
enforcing said desired design data hierarchy using said plurality of distinct buckets to correct for optical lithography.

6. A method of performing model-based optical lithography corrections comprising:
providing a cell array layout representative of a desired design data hierarchy having a plurality of polygons thereon;
partitioning said cell array layout into a plurality of cells;
providing a density map corresponding to interactions between said polygons and said plurality of cells;
generating an interaction map based on said density map;
truncating said interaction map to generate a map of truncated cells, including assigning a reference designator selected from a group of reference designators to each of said truncated cells wherein identical reference designators denote substantially identical truncated cells;

segregating substantially identical groupings of said truncated cells respectively into differing ones of a plurality of buckets, whereby each of said plurality of buckets comprises a single set of said identical groupings of said truncated cells, generating a hierarchal arrangement using said plurality of buckets; and enforcing said desired design data hierarchy using said hierarchal arrangement to correct for optical lithography.

7. A program storage device readable by a machine, tangibly embodying a program of instructions executable by the machine to perform method steps for performing model-based optical proximity correction, said method steps comprising:

providing a cell array layout of a desired design data hierarchy having a plurality of finite geometrical shapes;

partitioning said cell array layout into a plurality of cells;

generating an interaction map based on a density map corresponding to interactions between said plurality of finite geometrical shapes and said plurality of cells;

truncating said interaction map to generate a map of truncated cells, including assigning a reference designator selected from a group of reference designators to each of said truncated cells wherein identical reference designators denote substantially identical truncated cells;

grouping substantially identical occurrences of selected ones of said truncated cells into a single bucket selected from a plurality of distinct buckets; and enforcing said desired design data hierarchy using said plurality of distinct buckets to correct for optical lithography.

8. A program storage device readable by a machine, tangibly embodying a program of instructions executable by the machine to perform method steps for performing model-based optical proximity correction, said method steps comprising:

providing a cell array layout representative of a desired design data hierarchy having a plurality of polygons thereon;

partitioning said cell array layout into a plurality of cells;

providing a density map corresponding to interactions between said polygons and said plurality of cells;

generating an interaction map based on said density map;

truncating said interaction map to generate a map of truncated cells, including assigning a reference designator selected from a group of reference designators to each of said truncated cells wherein identical reference designators denote substantially identical truncated cells;

segregating substantially identical groupings of said truncated cells respectively into differing ones of a plurality of buckets, whereby each of said plurality of buckets comprises a single set of said identical groupings of said truncated cells, generating a hierarchal arrangement using said plurality of buckets; and enforcing said desired design data hierarchy using said hierarchal arrangement to correct for optical lithography.

* * * * *